United States Patent
Wuppermann

(10) Patent No.: US 7,154,306 B2
(45) Date of Patent: Dec. 26, 2006

(54) CIRCUIT AND METHOD FOR PERFORMING TRACK AND HOLD OPERATIONS

(75) Inventor: Bernd Wuppermann, Pacifica, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/882,456

(22) Filed: Jul. 1, 2004

(65) Prior Publication Data

US 2006/0001455 A1    Jan. 5, 2006

(51) Int. Cl.
*G11C 27/02* (2006.01)

(52) U.S. Cl. .................................................. 327/94

(58) Field of Classification Search .............. 327/91, 327/93–95, 96, 359
See application file for complete search history.

(56) References Cited

U.S. PATENT DOCUMENTS 4,285,051 A * 8/1981 Henneuse .................... 365/45
5,130,572 A * 7/1992 Stitt et al. .................... 327/96
5,298,801 A * 3/1994 Vorenkamp et al. .......... 327/91
5,736,878 A * 4/1998 McLeod ...................... 327/94
5,825,209 A * 10/1998 Stark et al. ................... 327/3
6,538,486 B1 * 3/2003 Chen et al. .................. 327/202

OTHER PUBLICATIONS

Bernd Pregardier, Ulrich Langmann, and William J. Hillery, "A 1.2-GS/S 8-b Silicon Bipolar Track&Hold IC", IEEE Journal of Solid-State Circuits, Sep. 1996, vol. 31, No. 9, pp. 1336-1339.

* cited by examiner

*Primary Examiner*—My-Trang Nu Ton

(57) ABSTRACT

A circuit and method for performing track and hold operations utilizes a circuit configuration in which a hold capacitor connected to a track signal path can be selectively isolated from an input signal applied to a control device on a common signal path by a switching mechanism, which is used to switch the circuit between track and hold modes of operation. The switching mechanism operates to connect either the track signal path or a hold signal path to the common signal path. When the track signal path is connected to the common signal path, electrical charge is allowed to be stored in the hold capacitor. When the hold signal path is connected to the common signal path, the hold capacitor is electrically isolated to hold the stored electrical charge.

20 Claims, 2 Drawing Sheets

US 7,154,306 B2

CIRCUIT AND METHOD FOR PERFORMING TRACK AND HOLD OPERATIONS

BACKGROUND OF THE INVENTION

A track-and-hold (T/H) circuit tracks an analog input signal and, at specified intervals, holds the amplitude of the signal, which is then sampled for subsequent use. Consequently, the T/H circuit operates by repeatedly switching between a track mode of operation and a hold mode of operation. A typical T/H circuit includes a hold capacitor that stores an electrical charge during a track mode of operation and holds the stored electrical charge during a hold mode of operation. The electrical charge stored in the hold capacitor is held by electrically isolating the hold capacitor when the T/H circuit is switched from the track mode to the hold mode. The electrical charge held by the hold capacitor reflects the amplitude of the input analog signal at the instant when the operational mode of the T/H circuit was changed from track to hold. The held value is then sampled and used, for example, as an input signal for an analog-to-digital (AD) converter.

One of the most basic T/H circuits includes a switch connected between an input node and an output node, and a shunt hold capacitor connected between the switch and the output node. During a track mode of operation, the switch is closed, allowing the hold capacitor to charge due to an analog input signal applied to the input node. During a hold mode of operation, the switch is opened, isolating the hold capacitor from the input analog signal. Thus, the electrical charge of the hold capacitor is held at the state when the switch was opened, which can be sampled through the output node. Although this basic T/H circuit can be used effectively in certain applications, a T/H circuit having better performance with respect to signal feedthrough, bandwidth, and switching speed is needed for use in, for example, high-speed analog-to-digital converters.

A conventional T/H circuit of interest that can be used in high-speed analog-to-digital converters is a switched emitter follower T/H circuit. A switched emitter follower T/H circuit utilizes an emitter follower to selectively charge a hold capacitor. The input analog signal is applied to the base of the emitter follower to track the signal during a track mode. The switched emitter follower T/H circuit includes an off resistor on the input signal path to ensure that the emitter follower is turned off during a hold mode. The switched emitter follower T/H circuit also includes a cancellation capacitor connected to the base of the emitter follower to reduce the input signal feeding through the emitter follower to the hold capacitor during a hold mode.

A concern with the switched emitter follower T/H circuit is that it is difficult to effectively cancel signal feedthrough with the cancellation capacitor since the signal feedthrough is caused by voltage dependent parasitic capacitance (base emitter capacitance). Another concern with the switched emitter follower T/H circuit is that the off resistor on the input signal path reduces the achievable bandwidth of the T/H circuit since the off resistor and the input capacitance of the emitter follower act like a RC-lowpass filter. This is further exacerbated by the cancellation capacitor, which increases the total input capacitance of the T/H circuit.

In view of these concerns, what is needed is a circuit and method for performing track and hold operations with wider bandwidth, higher signal-to-noise ratio and greater switching speed than comparable conventional T/H circuits.

SUMMARY OF THE INVENTION

A circuit and method for performing track and hold operations utilizes a circuit configuration in which a hold capacitor connected to a track signal path can be selectively isolated from an input signal applied to a control device on a common signal path by a switching mechanism, which is used to switch the circuit between track and hold modes of operation. The switching mechanism operates to connect either the track signal path or a hold signal path to the common signal path. When the track signal path is connected to the common signal path, electrical charge is allowed to be stored in the hold capacitor. When the hold signal path is connected to the common signal path, the hold capacitor is electrically isolated to hold the stored electrical charge.

A track-and-hold circuit in accordance with an embodiment of the invention comprises a first stage, a second stage and a third stage. The first stage includes an input to receive an input signal. The input is connected to a control device on a first signal path to regulate current conducted through the first signal path using the input signal. The second stage is connected to the first stage. The second stage includes a switching mechanism to conduct current through one of second and third signal paths. The third stage is connected to the second stage such that the second stage is connected between the first and third stages. The third stage includes a hold capacitor connected to the second signal path to store an electrical charge associated with the input signal. The third stage further includes a switching device on the second signal path to selectively charge the hold capacitor in response to the input signal.

A track-and-hold circuit in accordance with another embodiment of the invention comprises a switching device, a switching mechanism, a hold capacitor, and a control device. The switching device is on a track signal path connected to a first voltage terminal. The switching mechanism is positioned between the track signal path, a hold signal path and a common signal path. The hold signal path is connected to the first voltage terminal. The common signal path is connected to a second voltage terminal. The switching mechanism is configured to selectively connect one of the track and hold signal paths to the common signal path. The hold capacitor is connected to the track signal path between the switching device and the switching mechanism. The control device is on the common signal path. The control device includes a control terminal connected to an input to receive an input signal to allow electrical charge to be stored in the hold capacitor in response to the input signal when the track signal path is connected to the common signal path via the switching mechanism.

A method for performing track and hold operations in accordance with an embodiment of the invention includes controlling current being conducted through a common signal path in response to an input signal, selectively connecting the common signal path to one of a track signal path and a hold signal path, conducting current through the track signal path and the common signal path when the track signal path is connected to the common signal path and conducting current through the hold signal path and the common signal path when the hold signal path is connected to the common signal path. The conducting of current through the track signal path includes storing an electrical charge in response to the input signal. The conducting of current through the hold signal path includes isolating the electrical charge to hold the electrical charge, which corresponds to the input signal when the common signal path is connected to the hold signal path.

Other aspects and advantages of the present invention will become apparent from the following detailed description, taken in conjunction with the accompanying drawings, illustrated by way of example of the principles of the invention.

DETAILED DESCRIPTION OF THE INVENTION

Figure 1:
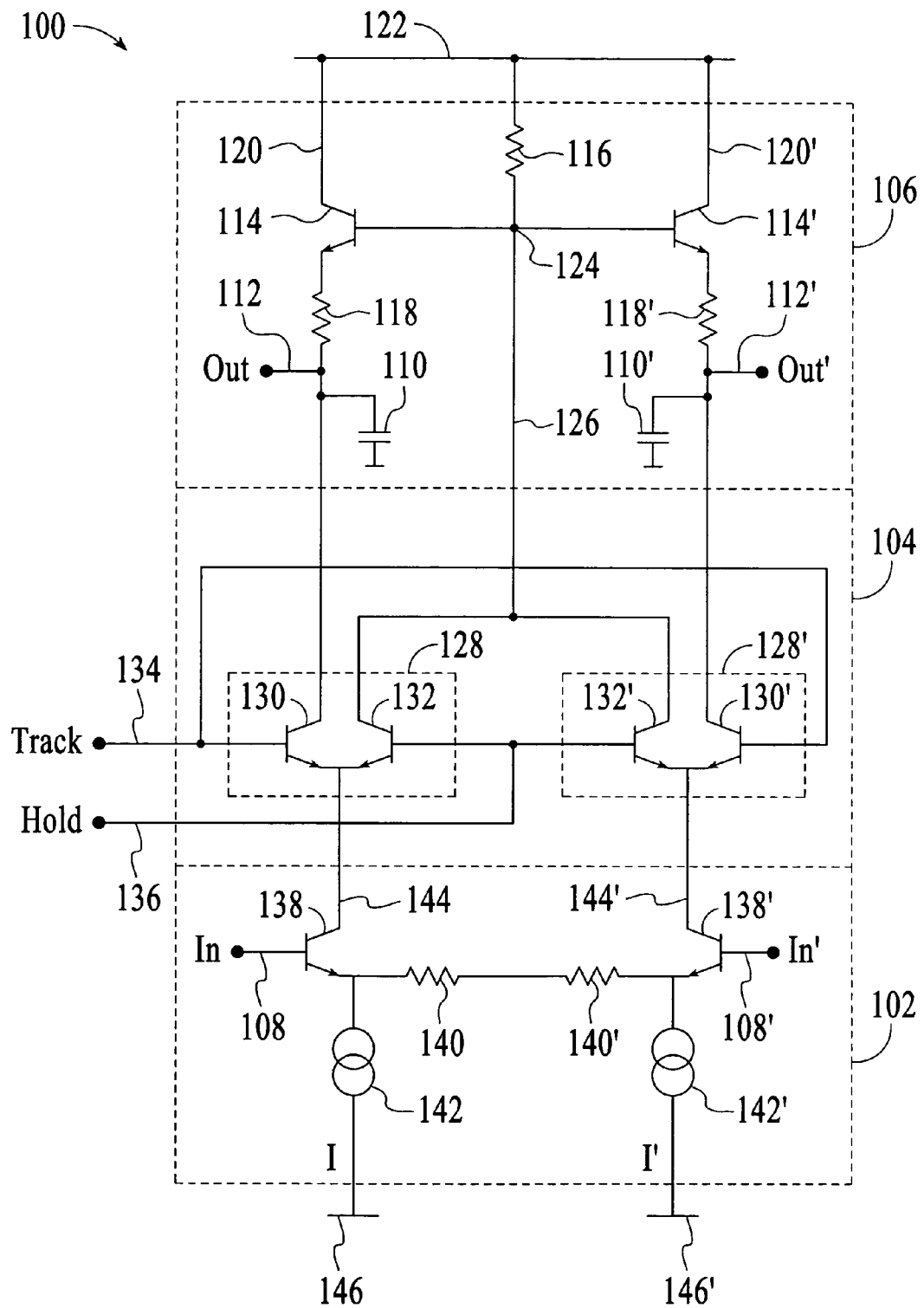
FIG. 1 is a diagram of a track-and-hold (T/H) circuit in accordance with an embodiment of the invention.

With reference to FIG. 1, a track-and-hold (T/H) circuit 100 in accordance with an embodiment of the invention is described. The T/H circuit 100 is designed to track differential input analog signals IN and IN' during track modes of operation and hold the amplitudes of the differential input analog signals as electrical charges during hold modes of operation. The held electrical charges can be sampled as differential output signals OUT and OUT' for use, for example, as input signals for an analog-to-digital (AD) converter. As described in more detail below, the T/H circuit 100 is designed to achieve wider bandwidth and greater switching speed than comparable conventional T/H circuits. In addition, the design of the T/H circuit 100 provides better isolation between the differential input analog signals IN and IN' and the electrical charges being held during hold modes of operations, which produces more accurate output signals.

As shown in FIG. 1, the T/H circuit 100 includes an input stage 102, a switching stage 104 and a common base stage 106. The input stage 102 receives the differential input analog signals IN and IN' at inputs 108 and 108', and amplifies the signals. The switching stage 104 selectively switches the T/H circuit 100 between track and hold modes of operation. The common base stage 106 stores electrical charge in hold capacitors 110 and 110' during track operational modes in response to the differential input analog signals IN and IN', and holds the stored electrical charge in the hold capacitors 110 and 110' during the hold operational modes. The held electrical charge in the hold capacitors 110 and 110' can be sampled through outputs 112 and 112' as the differential output signals OUT and OUT'.

The common base stage 106 of the T/H circuit 100 includes bipolar transistors 114 and 114', an off resistor 116, load resistors 118 and 118' and the hold capacitors 110 and 110'. The bipolar transistor 114 is situated on a track signal path 120, while the bipolar transistor 114' is situated on a track signal path 120'. As described in more detail below, current is conducted through the track signal paths 120 and 120' during track modes of operation. As shown in FIG. 1, the bipolar transistors 114 and 114' are connected as emitter followers. The collectors of the transistors 114 and 114' are both connected to a voltage terminal or rail 122, which provides a supply voltage. The bases of the transistors 114 and 114' are connected to each other at a node 124 on a hold signal path 126. In contrast to the track signal paths 120 and 120', the hold signal path 126 is used to conduct current during hold mode of operation. The off resistor 116 is connected between the voltage rail 122 and the node 124 on the signal path 126. The off resistor 116 provides the necessary voltage drop to turn off the emitter followers 114 and 114' during hold modes of operation. The load resistor 118 is connected to the emitter of the transistor 114 on the signal path 120. Similarly, the load resistor 118' is connected to the emitter of the transistor 114' on the signal path 120'. The hold capacitors 110 and 110' are shunt capacitors connected to the signal paths 120 and 120', respectively. The hold capacitors 110 and 110' are selectively isolated from the voltage rail 122 when the emitter followers 114 and 114' are turned off during hold modes of operation.

The switching stage 104 of the T/H circuit 100 includes switching mechanisms 128 and 128'. The switching mechanism 128 is used to selectively conduct current through the signal path 120 or 126 to track and hold the input analog signal IN in the form of an electrical charge in the hold capacitor 110, while the switching mechanism 128' is used to selectively conduct current through the signal path 120' or 126' to track and hold the other input analog signal IN' in the form of an electrical charge in the hold capacitor 110'. The switching mechanism 128 includes a pair of transistors, a track transistor 130 and a hold transistor 132. Similarly, the switching mechanism 128' includes a pair of transistors, a track transistor 130' and a hold transistor 132'. The collector of the track transistor 130 is connected to the load resistor 118 on the signal path 120, while the collector of the hold transistor 132 is connected to the node 124 on the signal path 126. Likewise, the collector of the track transistor 130' is connected to the load resistor 118' on the signal path 120', while the collector of the hold transistor 132' is connected to the node 124 on the signal path 126. The emitters of the track and hold transistors 130 and 132 are connected to each other. The emitters of the track and hold transistors 130' and 132' are also connected to each other. The bases of the track transistors 130 and 130' are both connected to a terminal 134 to receive a track signal, which is responsible for controlling the track transistors to switch the T/H circuit 100 to a track mode of operation. The bases of the hold transistors 132 and 132' are both connected to a terminal 136 to receive a hold signal, which is responsible for controlling the hold transistors to switch the T/H circuit 100 to a hold mode of operation.

The input stage 102 of the T/H circuit 100 includes control devices 138 and 138' in the form of bipolar transistors, resistors 140 and 140' and current sources 142 and 142'. The transistor 138 and the current source 140 are connected in series on a common signal path 144 that is used for both track and hold modes of operation. The common signal path 144 is connected between the emitters of the track and hold transistors 130 and 132 of the switching mechanism 128 and a voltage terminal 146, which is connected to electrical ground. The collector of the transistor 138 is connected to the switching mechanism 128, and its emitter is connected to the current source 142. The base of the transistor 138 is connected to the input 108, which receives the input analog signal IN. Similarly, the transistor 138' and the current source 142' are connected in series on a common signal path 144' connected between the emitters of the track and hold transistors 130' and 132' of the switching mechanism 128' and a voltage terminal 146', which is also connected to electrical ground. The collector of the transistor 138' is connected to the switching mechanism 128', and its emitter is connected to the current source 142'. The base of the transistor 128' is connected to the input 108', which receives the input analog signal IN'.

In a track mode of operation, the T/H circuit 100 operates to store electrical charge in the hold capacitors 110 and 110' in response the differential input analog signals IN and IN', tracking the amplitudes of the input analog signals. The T/H circuit 100 is switched to the track mode by applying appropriate track and hold signals to the switching mechanisms 128 and 128'. Specifically, an activating track signal is applied to the bases of the track transistors 130 and 130' via the terminal 134, and a deactivating hold signal is applied to the bases of the hold transistors 132 and 132' via the terminal 136. In this embodiment, an activating signal is a high signal, while a deactivating signal is a low signal. The deactivating hold signal turns off the hold transistors 132 and 132'. As a result, the signal path 126 is disconnected from the signal paths 144 and 144'. The activating track signal turns on the track transistor 130, which connects the signal path 120 to the signal path 144. The activating track signal also turns on the track transistor 130', which connects the signal path 120' to the signal path 144'. Thus, currents I and I' are conducted through the signal paths 120 and 120', respectively. Consequently, electrical charges are stored in the hold capacitors 110 and 110'. The electrical charges stored in the hold capacitors 110 and 110' are dependent on the currents I and I', respectively. The conducted currents I and I' are in turn dependent on the differential input analog signals IN and IN', respectively, which are applied to the bases of the transistors 138 and 138' via the inputs 108 and 108'. The input analog signal IN controls the transistor 138, which regulates the current Ion the signal path 144. Similarly, the input analog signal IN' controls the transistor 138', which regulates the current I' on the signal path 144'. Consequently, the electrical charges stored in the hold capacitors 110 and 110' when the T/H circuit 100 is in a track mode of operations reflects the amplitude of the differential input analog signals IN and IN', respectively.

In a hold mode of operation, the T/H circuit 100 operates to hold the electrical charges stored in the hold capacitors 110 and 110' when the T/H circuit is switched from a track mode of operation to the hold mode of operation. The T/H circuit 100 is switched to the hold mode by applying appropriate track and hold signals to the switching mechanisms 128 and 128'. Specifically, a deactivating track signal is applied to the bases of the track transistors 130 and 130' via the terminal 134, and an activating hold signal is applied to the bases of the hold transistors 132 and 132' via the terminal 136. The deactivating track signal turns off the track transistor 130, which disconnects the signal path 120 from the signal path 144. The deactivating track signal also turns off the track transistor 130', which disconnects the signal path 120' from the signal path 144'. The activating hold signal turns on the hold transistors 132 and 132', which connects the signal path 126 to the signal paths 144 and 144'. As a result, currents I and I' are conducted through the signal paths 144 and 144', respectively, and current I+I' is connected through the signal path 126. Furthermore, the emitter followers 114 and 114' are turned off by a voltage drop at the node 124 due to the off resistor 116 on the signal path 126. With the emitter followers 114 and 114' and the track transistors 130 and 130' turned off, the hold capacitors 110 and 110' are effectively isolated, holding the electrical charges stored in the hold capacitors. The held electrical charges in the hold capacitors 110 and 110' can be sampled through the outputs 112 and 112' as output signals OUT and OUT', which can be used, for example, as inputs to a analog-to-digital converter.

The T/H circuit 100 has the following advantages over a conventional switched emitter follower T/H circuit. Since the off resistor 116 of the T/H circuit 100 is not located on a signal path of the input signals IN and IN', the off resistor does not impact the signal bandwidth of the T/H circuit between hold and track modes of operation. In a hold mode of operation, the differential input analog signals IN and IN' are effectively isolated from the hold capacitors 110 and 110' of the T/H circuit 100 because the input signals are not applied to the bases of the emitter followers 114 and 114', as is the case for the conventional switched emitter follower T/H circuit. Thus, the T/H circuit 100 does not require the use of cancellation capacitors, which are used by the conventional switched emitter follower T/H circuit to reduce the input signals feeding through the emitter followers to the hold capacitors. The T/H circuit 100 has an inherently lower kick back than the conventional switched emitter follower T/H circuit since the external driving signal source (not shown) does not have to provide the currents I and I' conducted through the current sources 142 and 142' when the T/H circuit is switched to a hold mode of operation. Furthermore, since the switching mechanisms 128 and 128' of the T/H circuit 100 are isolated from the inputs 108 and 108', the input resistance does not impact the switching speed of the T/H circuit between hold and track modes of operation. Lastly, the DC level of the output signals OUT and OUT' provided by the T/H circuit 100 is higher than the DC level of the differential input analog signals IN and IN'. This allows the T/H circuit 100 to be used with emitter follower buffers without the need for amplifiers for upward level shifting, which is advantageous, for example, in a master-slave T/H configuration.

Figure 2:
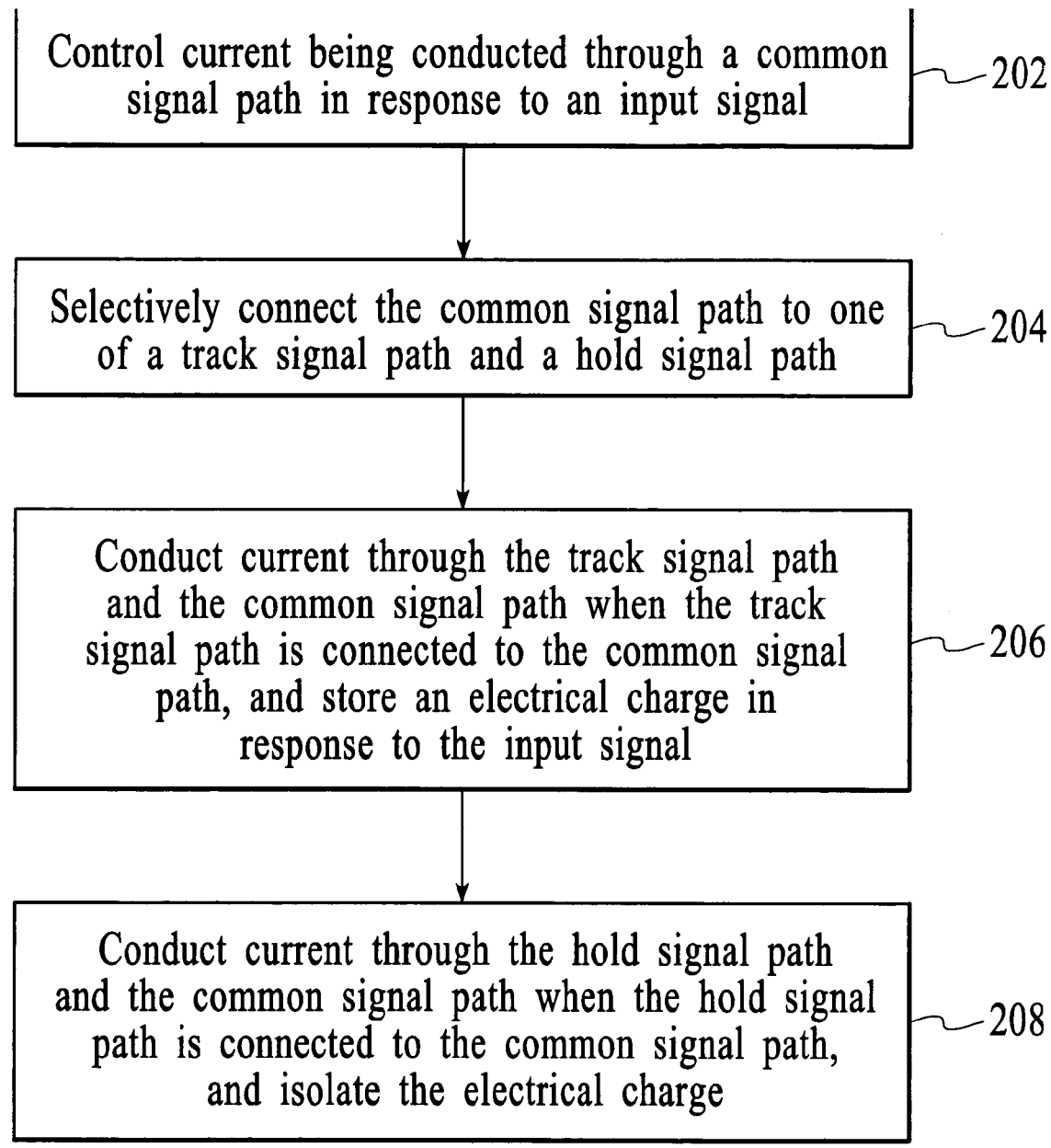
FIG. 2 is a flowchart of a method for performing track and hold operations in accordance with an embodiment of the invention.

A method for performing track-and-hold operations in accordance with an embodiment of the invention is described with reference to a flow diagram of FIG. 2. At block 202, current being conducted through a common signal path is controlled in response to an input signal. Next, at block 204, the common signal path is selectively connected to one of a track signal path and a hold signal path. Next, at block 206, current is conducted through the track signal path and the common signal path when the track signal path is connected to the common signal path. At block 206, an electrical charge is also stored in response to the input signal. Next, at block 208, current is conducted through the hold signal path and the common signal path when the hold signal path is connected to the common signal path. At block 208, the stored electrical charge is also isolated to hold the electrical charge, which corresponds to the input signal when the common signal path is connected to the hold signal path.

Although specific embodiments of the invention have been described and illustrated, the invention is not to be limited to the specific forms or arrangements of parts as described and illustrated herein. As an example, although the transistors 114, 114', 130, 130', 132, 132', 138 and 138' of the T/H circuit 100 have been described herein as being bipolar transistors, these transistors can be other types of transistors, such as metal oxide semiconductor (MOS) transistors. The scope of the invention is to be defined by the claims appended hereto and their equivalents.

What is claimed is:

1. A track-and-hold circuit comprising:
   a first stage including an input to receive an input signal, said input being connected to a control device on a first signal path to regulate current conducted through said first signal path using said input signal;
   a second stage connected to said first stage, said second stage including a switching mechanism to conduct current through one of second and third signal paths; and
   a third stage connected to said second stage such that said second stage is connected between said first and third stages, said third stage including a hold capacitor connected to said second signal path to store an electrical charge associated with said input signal, said third stage further including a switching device on said second signal path to selectively charge said hold capacitor in response to said input signal.

2. The track-and-hold circuit of claim 1 wherein said control device includes a transistor connected in series with said switching device such that said hold capacitor is connected to said second signal path between said switching device and said transistor.

3. The track-and-hold circuit of claim 2 wherein said switching device includes an emitter follower.

4. The track-and-hold circuit of claim 3 further comprising a load resistor connected to the emitter of said emitter follower.

5. The track-and-hold circuit of claim 2 further comprising a resistor on said third signal path, said resistor being connected to a control terminal of said switching device.

6. The track-and-hold circuit of claim 2 wherein said switching mechanism includes a track transistor and a hold transistor, said track transistor being positioned to connect said second signal path to said first signal path, said hold transistor being positioned to connected said third signal path to said first signal path.

7. The track-and-hold circuit of claim 1 wherein said first stage includes a second input to receive a second input signal, said second input being connected to a second control device on a fourth signal path to regulate current conducted through said fourth signal path using said second input signal, wherein said second stage includes a second switching mechanism to conduct current through one of said third signal path and a fifth signal path, and wherein said third stage includes a second hold capacitor connected to said fifth signal path to store an electrical charge associated with said second input signal, said third stage further including a second switching device on said fifth signal path to selectively isolate said second hold capacitor.

8. The track-and-hold circuit of claim 7 wherein control terminals of said switching device and said second switching device are connected to each other at a node on said third signal path.

9. The track-and-hold circuit of claim 1 further comprising:
a second switching device on a second track signal path connected to said first voltage terminal;
a second switching mechanism positioned between said second track signal path, said hold signal path and a second common signal path, said hold signal path being connected to said first voltage terminal, said second common signal path being connected to said second voltage terminal, said second switching mechanism being configured to selectively connect one of said second track signal path and said hold signal path to said second common signal path;
a second hold capacitor connected to said second track signal path between said second switching device and said second switching mechanism; and
a second control device on said second common signal path, said second control device having a control terminal connected to a second input to receive a second input signal to allow electrical charge to be stored in said second hold capacitor in response to said second input signal when said second track signal path is connected to said second common signal path via said second switching mechanism.

10. The track-and-hold circuit of claim 9 wherein control terminals of said switching device and said second switching device are connected to each other at a node on said hold signal path.

11. A track-and-hold circuit comprising:
a switching device on a track signal path connected to a first voltage terminal;
a switching mechanism positioned between said track signal path, a hold signal path and a common signal path, said hold signal path being connected to said first voltage terminal, said common signal path being connected to a second voltage terminal, said switching mechanism being configured to selectively connect one of said track and hold signal paths to said common signal path;
a hold capacitor connected to said track signal path between said switching device and said switching mechanism; and
a control device on said common signal path, said control device including a control terminal connected to an input to receive an input signal to allow electrical charge to be stored in said hold capacitor in response to said input signal when said track signal path is connected to said common signal path via said switching mechanism.

12. The track-and-hold circuit of claim 11 wherein said control device includes a transistor connected in series with said switching device such that said hold capacitor is connected to said track signal path between said switching device and said transistor.

13. The track-and-hold circuit of claim 12 wherein said switching device includes an emitter follower.

14. The track-and-hold circuit of claim 13 further comprising a load resistor connected to the emitter of said emitter follower.

15. The track-and-hold circuit of claim 12 further comprising a resistor on said hold signal path, said resistor being connected to a control terminal of said switching device.

16. The track-and-hold circuit of claim 12 wherein said switching mechanism includes a track transistor and a hold transistor, said track transistor being positioned to connect said track signal path to said common signal path, said hold transistor being positioned to connected said hold signal path to said common signal path.

17. A method for performing track and hold operations, said method comprising:
controlling current being conducted through a common signal path in response to an input signal;
selectively connecting said common signal path to one of a track signal path and a hold signal path;
conducting current through said track signal path and said common signal path when said track signal path is connected to said common signal path, including storing an electrical charge in response to said input signal; and
conducting current through said hold signal path and said common signal path when said hold signal path is connected to said common signal path, including isolating said electrical charge to hold said electrical charge, said electrical charge corresponding to said input signal when said common signal path is connected to said hold signal path.

18. The method of claim 17 wherein said controlling includes applying said input signal to a control terminal of a transistor on said common signal path.

19. The method of claim 17 wherein said conducting said current through said hold signal path includes deactivating a switching device on said track signal path to hold said electrical charge.

20. The method of claim 17 further comprising:
- controlling current being conducted through a second common signal path in response to a second input signal;
- selectively connecting said second common signal path to one of a second track signal path and said hold signal path;
- conducting current through said second track signal path and said second common signal path when said second track signal path is connected to said second common signal path, including storing a second electrical charge in response to said second input signal; and
- conducting current through said hold signal path and said second common signal path when said hold signal path is connected to said second common signal path, including isolating said second electrical charge to hold said second electrical charge that correspond to said second input signal when said second common signal path is connected to said hold signal path.

\* \* \* \* \*